US010524052B2

(12) United States Patent
Bharitkar

(10) Patent No.: US 10,524,052 B2
(45) Date of Patent: Dec. 31, 2019

(54) DOMINANT SUB-BAND DETERMINATION

(71) Applicant: HEWLETT-PACKARD DEVELOPMENT COMPANY, L.P., Houston, TX (US)

(72) Inventor: Sunil Bharitkar, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 15/972,069

(22) Filed: May 4, 2018

(65) Prior Publication Data

US 2019/0342661 A1 Nov. 7, 2019

(51) Int. Cl.
*H03G 5/00* (2006.01)
*H03G 3/00* (2006.01)
*H04R 3/04* (2006.01)
*G10L 25/18* (2013.01)

(52) U.S. Cl.
CPC ................ *H04R 3/04* (2013.01); *G10L 25/18* (2013.01)

(58) Field of Classification Search
CPC ........ H03G 9/025; H03G 7/002; H03G 5/165; G10L 21/0232
USPC .......................................... 381/98, 102, 103
See application file for complete search history.

(56) References Cited

U.S. PATENT DOCUMENTS 3,622,714 A 11/1971 Berkley
4,706,290 A * 11/1987 Lin ........................ G01R 23/20 381/58
5,615,302 A 3/1997 McEachern
6,285,767 B1 9/2001 Klayman
8,386,242 B2 2/2013 Kim et al.
8,705,764 B2 4/2014 Baritkar et al.
8,873,763 B2 10/2014 Tsang
8,971,551 B2 3/2015 Ekstrand
2010/0086148 A1* 4/2010 Hung ..................... H03G 5/165 381/98
2014/0211954 A1* 7/2014 Hetherington ........... H04R 3/02 381/57
2014/0309992 A1 10/2014 Carney
2016/0155441 A1* 6/2016 Panda ..................... G10L 25/51 704/233

* cited by examiner

*Primary Examiner* — George C Monikang
(74) *Attorney, Agent, or Firm* — Fabian VanCott

(57) ABSTRACT

An example system includes a filter bank of sub-octave filters to separate a lower frequency portion of an audio input stream into a number of sub-bands. A detector bank of detectors coupled with the filter bank determines an audio power level in each of the sub-bands. A sub-band selection engine coupled with the detector bank determines a dominant sub-band. A first filter engine isolates the dominant sub-band from the audio input stream and a harmonic engine coupled with the first filter generates harmonics of the dominant sub-band. A second filter engine coupled with the harmonic engine selects a sub-set of the harmonics to combine with a higher frequency portion of the audio input stream.

20 Claims, 11 Drawing Sheets

300

| FILTER ID (r) | $f_L$ (Hz) | $f_U$ (Hz) |
|---|---|---|
| 1 | 5 | 18 |
| 2 | 17 | 22 |
| 3 | 20 | 26 |
| 4 | 25 | 32 |
| 5 | 31 | 40 |
| 6 | 38 | 48 |
| 7 | 47 | 60 |
| 8 | 58 | 74 |
| 9 | 73 | 92 |
| 10 | 90 | 114 |
| 11 | 114 | 144 |
| 12 | 142 | 179 |
| 13 | 179 | 226 |
| 14 | 224 | 283 |

Figure 3

1200

| FILTER ID | $f_L$ (Hz) | $f_U$ (Hz) |
|---|---|---|
| 1 | 19 | 22 |
| 2 | 21 | 24 |
| 3 | 23 | 26 |
| 4 | 25 | 29 |
| 5 | 28 | 32 |
| 6 | 31 | 35 |
| 7 | 34 | 39 |
| 8 | 37 | 42 |
| 9 | 41 | 47 |
| 10 | 46 | 52 |
| 11 | 51 | 58 |
| 12 | 56 | 63 |
| 13 | 63 | 71 |
| 14 | 70 | 79 |
| 15 | 79 | 89 |
| 16 | 88 | 99 |
| 17 | 99 | 112 |
| 18 | 110 | 124 |
| 19 | 123 | 139 |
| 20 | 137 | 154 |
| 21 | 153 | 172 |
| 22 | 171 | 192 |
| 23 | 192 | 216 |
| 24 | 215 | 242 |

Figure 12

DOMINANT SUB-BAND DETERMINATION

BACKGROUND

A computing device may include multiple user interface components. For example, the computing device may include a display to produce images viewable by a user. The computing device may include a mouse, a keyboard, a touchscreen, or the like to allow the user to provide input. The computing device may also include a speaker, a headphone jack for use with headphones or earbuds, or the like, to produce audio that can be heard by the user. The user may listen to various types of audio with the computing device, such as music, sound associated with a video, the voice of another person (e.g., a voice transmitted in real time over a network), or the like. The computing device may be a desktop computer, an all-in-one computer, a mobile device (e.g., a notebook, a tablet, a mobile phone, etc.), or the like, having an audio output device with a limited low frequency response.

BRIEF DESCRIPTION OF THE DRAWINGS

For a more complete understanding of various examples, reference is now made to the following description taken in connection with the accompanying drawings in which:

FIG. 3 is a table illustrating the cutoff frequencies of an example auditory filter bank;

FIG. 12 is a table illustrating the cutoff frequencies of another example auditory filter bank;

DETAILED DESCRIPTION

A computing device may be small to reduce weight and size, which may make the computing device easier for a user to transport. The computing device may have audio output devices with limited capabilities. For example, the audio output devices may be small to fit within the computing device and to reduce the weight contributed by the audio output devices. However, small audio output devices may provide a poor frequency response at low frequencies. The electro-mechanical speaker drivers may be unable to move enough volume of air to produce low frequency tones at the volume that they exist in the original audio stream. Accordingly, the low frequency portions of an audio stream may be lost when the audio stream is played by the computing device, thereby limiting the bandwidth of the reproduced audio stream. Similarly, a user may listen to audio by connecting ear buds or headphones to the computing device, which may also have limited abilities to accurately reproduce low frequency portions of the original audio stream.

To compensate for the loss of low frequencies in the audio output device, the audio signal may be modified to create the perception of the low frequency component being present. In an example, harmonics of the low frequency signals may be added to the audio stream. The inclusion of the harmonics may create the perception in listeners that the fundamental frequency is present even though the audio output device is unable to produce the fundamental frequency. This is known as the missing fundamental effect in psycho-acoustics, where the human brain and hearing system operate to fill-in the fundamental frequency when it is missing. This principle is used with naturally occurring harmonics in the US telephone system, which operates with a bandwidth between 300 Hertz and 3000 Hertz, while allowing listeners to discern male voices with a mean lower frequency of approximately 150 Hertz.

The harmonics may be produced artificially by applying non-linear processing to a low frequency portion of the audio stream. However, if the span of the low frequency portion is too broad, then the non-linear processing may create intermodulation distortion (IMD) that is added to the audio stream. IMD can take the form of third-order intermodulation products and beat notes. When the harmonics and IMD products are added to the audio stream, the intermodulation distortion may cause the resultant audio signal to have less clarity and sound "muddied".

Various examples described herein provide for systems, methods and computer-readable media for extending the perceived bandwidth of an audio output device with a limited low frequency capability. For the purpose of the present application, any device that converts an electronic representation of an audio stream to an audio signal perceptible by humans shall be referred to as an audio output device, including without limitation, speakers, ear buds, and headphones.

Figure 1:
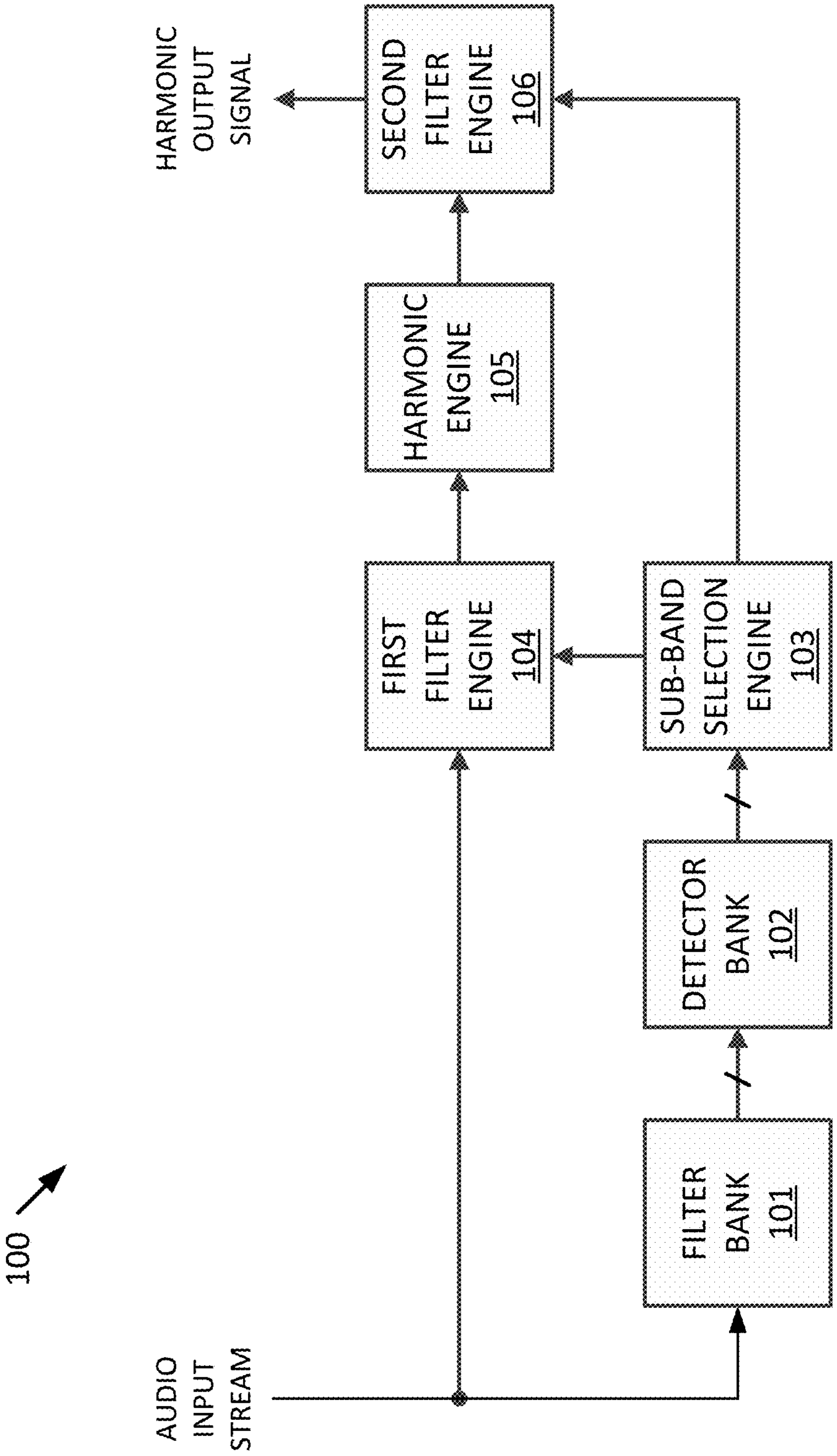
FIG. 1 is a block diagram of an example system to process an audio input.

FIG. 1 is a block diagram of an example system 100 for generating harmonics using a dominant sub-band of the lower frequency portion of an audio stream. As illustrated in FIG. 1, an audio input signal, or an audio stream, is applied to a filter bank 101 containing auditory filters that collectively span a selected lower frequency range of an audio stream.

The term auditory filter, as used herein, refers to a bandpass filter that corresponds to a critical frequency band in the human hearing system. In audiology, a critical band is a band of frequencies within which two separate frequencies cannot be readily distinguished. In some examples, as described in greater detail below, arrays of sub-octave bandpass filters may be used to simulate an array of critical band filters.

Continuing with the example of FIG. 1, the filter bank 101 separates the selected lower frequency portion of the audio input stream into at least two sub-bands, each corresponding to one of the auditory filters in the filter bank 101. Each sub-band signal is received by a corresponding detector in detector bank 102. In one example, detector bank 102 includes detectors to determine an audio power level in each of the at least two sub-bands of the filter bank 101. In one example, the power detectors may be RMS (root mean square) detectors.

The subsystem 100 may include a sub-band selection engine 103. As used herein, the term "engine" refers to hardware (e.g., a processor, such as an integrated circuit or other circuitry) or a combination of software (e.g., programming such as machine- or processor-executable instructions, commands, or code such as firmware, a device driver, programming, object code, etc.) and hardware. Hardware may include a hardware element with no software elements such as an application specific integrated circuit (ASIC), a Field Programmable Gate Array (FPGA), etc. A combination of hardware and software includes software hosted at hardware (e.g., a software module that is stored at a processor-readable memory such as random-access memory (RAM), a hard-disk or solid-state drive, resistive memory, or optical media such as a digital versatile disc (DVD), and/or executed or interpreted by a processor), or hardware and software hosted at hardware.

The sub-band selection engine 103 may select a dominant sub-band (or multiple sub-bands based on dominance in descending order for multiple band perceptual bandwidth extension) in the audio stream based on the maximum power detected by the detector bank 102 over a selected time period comprising a frame of the audio stream.

The subsystem 100 may also include a first filter engine 104. In one example, first filter engine 104 may synthesize a bandpass filter corresponding to the dominant sub-band selected by the sub-band selection engine 103. As illustrated in FIG. 1, the first filter engine 104 is coupled to the audio input stream. Accordingly, the first filter engine 104 operates to extract the dominant sub-band from the audio input stream and reject frequencies outside the dominant sub-band.

The subsystem 100 may include a harmonic engine 105 coupled to the first filter engine 104. The harmonic engine 105 may include a non-linear device that generates harmonics of the dominant sub-band. Finally, the example subsystem 100 may include a second filter engine 106, coupled to the harmonic engine 105, to select a subset of the harmonics generated by the harmonic engine 105, where the selected subset of harmonics of the dominant sub-band can be used to create the perception of low frequency content in an audio stream as described in greater detail below.

Figure 2:
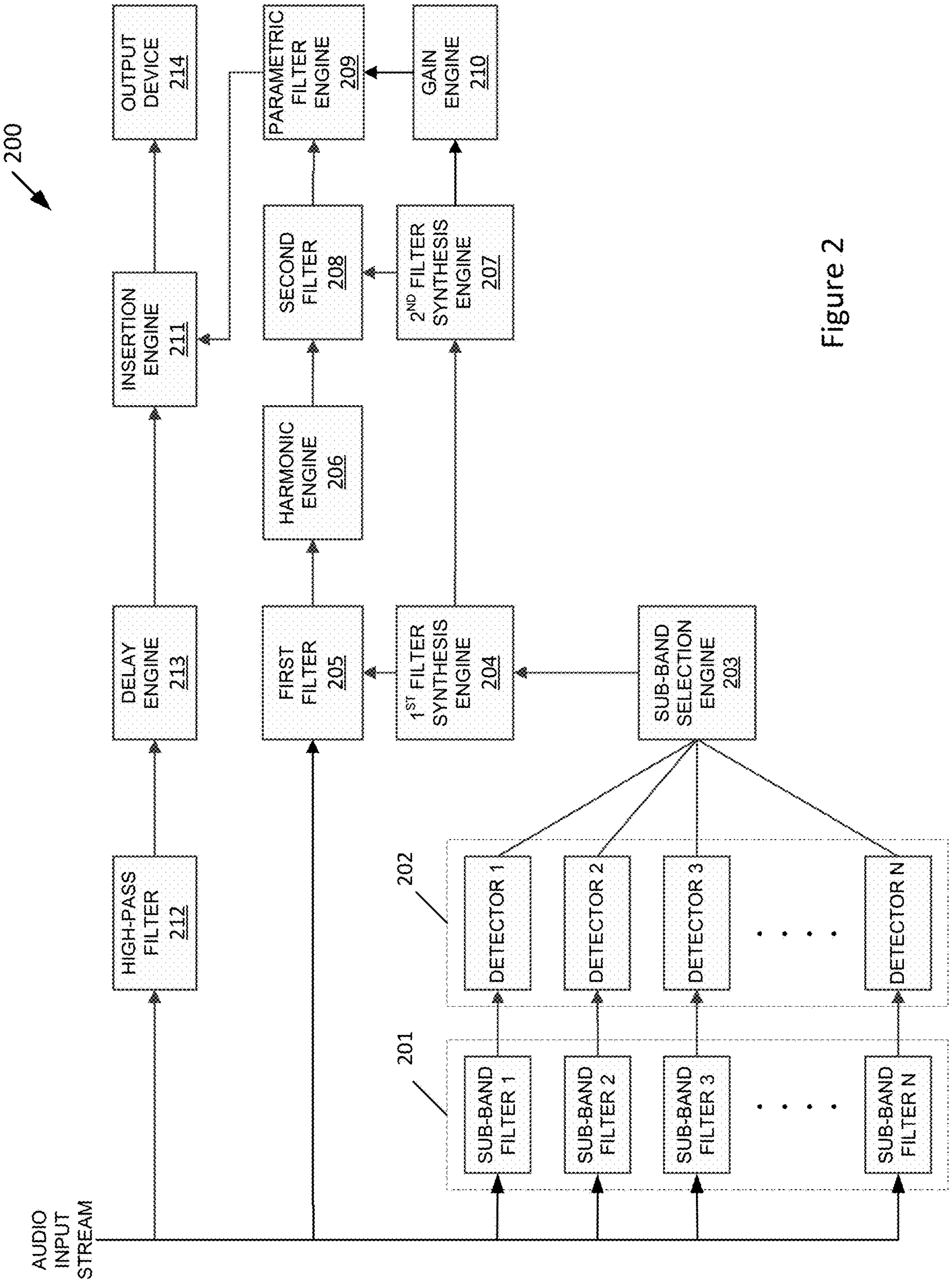
FIG. 2 is a block diagram of another example system to process an audio input.
Figure 4:
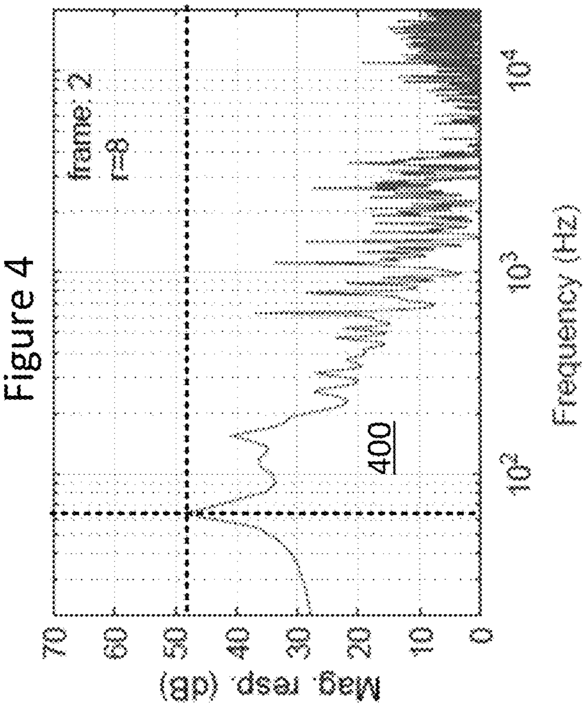
FIGS. 4-7 are frequency spectra illustrating the frequency content of four frames of an example audio sample.
Figure 5:
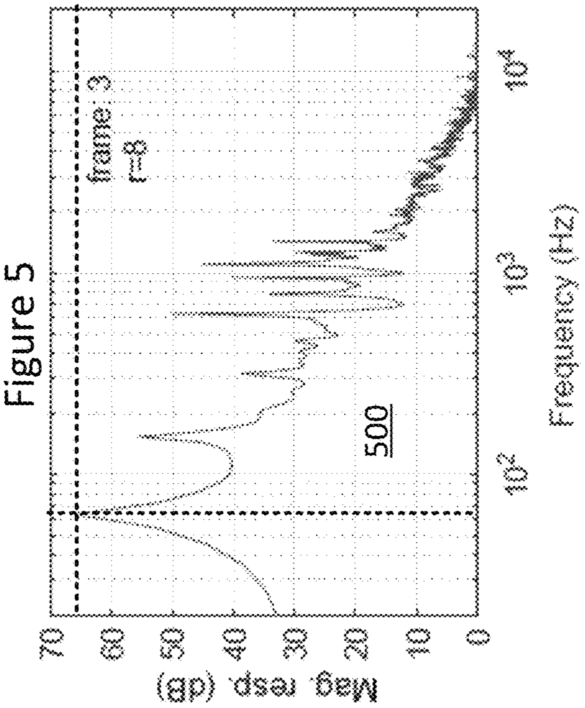
Figure 6:
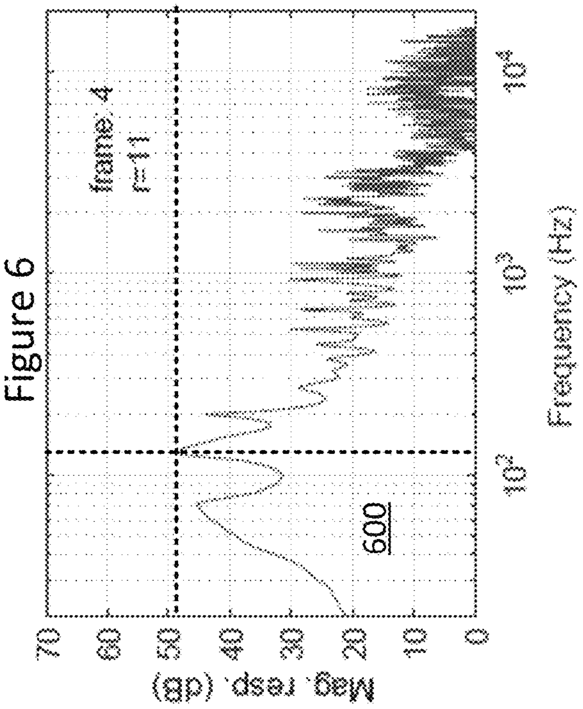
Figure 7:
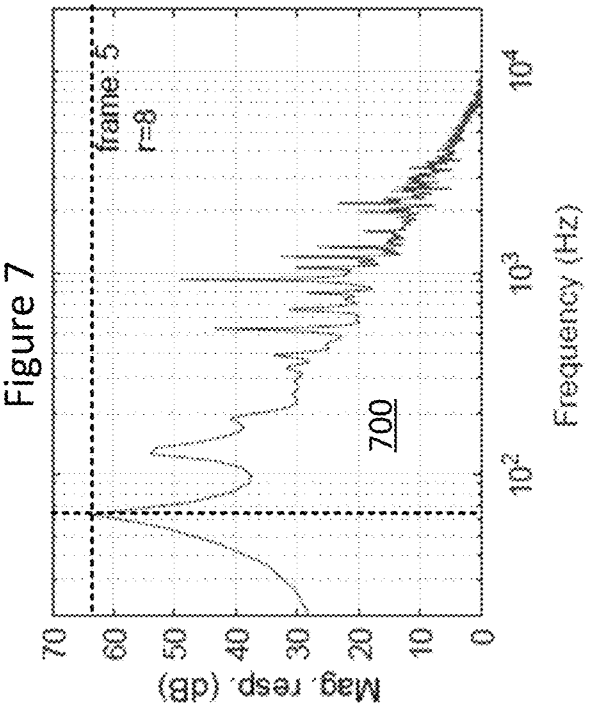

FIG. 2 is a block diagram of an example system 200 to produce an audio output that creates the perception of a low frequency component. As illustrated in FIG. 2, the example system 200 may include a filter bank 201 including auditory sub-band filters such as sub-band filters 1 to N in FIG. 2, which span a lower frequency portion of the audio input stream. The sub-band filters may split the lower frequency portion of the audio input stream into sub-band signals. In one example, described in greater detail below, the sub-band filters may comprise bandpass filters with overlapping cutoff frequencies. That is, the upper cutoff frequency of the nth sub-band filter ($f_{nU}$) overlaps the lower cutoff frequency of the (n+1)th sub-band filter ($f_{(n+1)L}$). In one example, the upper and lower cutoff frequencies may correspond to the 3-dB attenuation frequencies of the sub-band filters. In one example, the center frequency of each sub-band filter may have a sub-octave relationship with its adjacent filters, where the ratio of the center frequencies of two adjacent filters is a fractional power of 2, such as $2^{1/3}$, $2^{1/6}$, $2^{1/12}$, $2^{1/24}$, for example. Other types of filter banks that may be employed are the Equivalent Rectangular Bandwidth (ERB), Critical-bandwidth (CB), gammatone filter, etc. In one example, without limitation, the sub-band filters may be implemented in hardware, software, or a combination of hardware and software. In one example, the sub-band filters may be implemented as BR filters with a Butterworth response (i.e., maximally flat amplitude response). In one example, the filters may be implemented as second order IIR filters to minimize the computational requirements compared to a longer duration FIR filter.

The example system 200 may also include a detector bank 202 coupled to the filter bank 201, including power detectors, such as power detectors 1 to N corresponding to sub-band filters 1 to N. Each detector determines the power of the audio input stream in the detector's corresponding sub-band. Other examples, in lieu of power detection, include computing the infinity norm (max of the dB value) by first computing the fast Fourier transform (FFT), then the log-magnitude to obtain a dB value in each sub-band, and then selecting the largest dB-valued sub-band.

The example system 200 may process frames of audio samples. In some examples, the frames of samples may be non-overlapping. In other examples, the frames of samples may be overlapping, such as by advancing the frame one sample at a time, by a fraction of a frame (e.g., ¾, ⅔, ½, ⅓, ¼, etc.). Non-overlapping frames may allow for faster processing, which may prevent audio from becoming noticeably unsynchronized with related video signals. Overlapping frames may track changes in dominant frequencies more smoothly. The frame size may be predetermined based on a sampling frequency, a lowest pitch to be detected (e.g., a lowest pitch that is audible to a human listener), or the like. The frame size may correspond to a predetermined multiple of the period of the lowest pitch to be perceived. The predetermined multiple may be, for example, 0.5, 1, 1.5, 2, 2.5, 3, 3.5, 4, 4.5, 5, etc. A higher multiple may increase accuracy but involve processing of a larger number of samples.

The example system 200 may include a sub-band selection engine 203. The sub-band selection engine 203 may select a dominant sub-band in an audio input stream based on the maximum signal power detected in the sub-bands. In one example, the sub-band selection engine computes the RMS (root mean square) value of the output of each sub-band filter over a frame, and then selects the maximum RMS value as the dominant sub-band in that frame. Because the system 200 processes multiple frames of audio samples, the dominant sub-band may change from frame to frame. In some examples, the sub-band selection engine 203 may include a smoothing filter to prevent large changes in the dominant sub-band between frames. For example, for non-overlapping frames or overlapping frames with large advances, the dominant frequency may change rapidly between frames, which may produce noticeable artifacts in the audio output. The smoothing filter may cause the dominant frequency to change gradually from one frame to the next. Accordingly, large frame advances can be used to improve processing performance without creating artifacts in the audio output.

The example system 200 may include a first filter synthesis engine 204, coupled to the sub-band selection engine 203. The first filter synthesis engine 204 may be notified by the sub-band selection engine 203 of the dominant sub-band in the current frame. In turn, the first filter synthesis engine 204 synthesizes a first filter 205 based on the dominant sub-band in the current frame of the audio input stream. That is, first filter 205 is synthesized to replicate the sub-band filter corresponding to the dominant sub-band. In one example, first filter 205 may be a duplicate of the corresponding sub-band filter, or some variation corresponding to a critical band of an auditory filter. As used herein, the term "auditory filter" refers to any filter from a set of contiguous filters that can be used to model the response of the basilar membrane to sound. The basilar membrane, part of the human hearing system, is a pseudo-resonant structure that, like strings on an instrument, varies in width and stiffness. The "string" of the basilar membrane is not a set of parallel strings, as in a guitar, but a long structure that has different properties (width, stiffness, mass, damping, and the dimensions of the ducts that it couples to) at different points along its length. The motion of the basilar membrane is generally described as a traveling wave. The parameters of the membrane at a given point along its length determine its characteristic frequency, the frequency at which it is most sensitive to sound vibrations. The basilar membrane is widest and least stiff at the apex of the cochlea, and narrowest and most stiff at the base. High-frequency sounds localize near the base of the cochlea (near the round and oval windows), while low-frequency sounds localize near the apex.

As used herein, the term "critical band" refers to the passband of a particular auditory filter. In an example, the first filter synthesis engine 204 may select a first filter 205 corresponding to an auditory filter with a center frequency closest to the center frequency of the dominant sub-band. The first filter synthesis engine 204 may synthesize the first filter 205 based on the corresponding auditory filter, may load predetermined filter coefficients for the selected first filter 205, or the like. In one example, the first filter 205 may be a minimum phase IIP or FIR filter.

In one example, the first filter 205 may pass frequencies in the dominant sub-band from the audio input stream, and attenuate or reject all other frequencies in the audio input stream. In one example, the first filter 205 may include an input buffer or delay to compensate for the filtering, detection, selection and synthesis processes described herein, which require a finite amount of processing time.

The example system 200 may also include a harmonic engine 206 to generate harmonics of the frequencies in the dominant sub-band, including both even and odd harmonics. For example, the harmonic engine 206 may apply non-linear processing to the filtered signal to generate the harmonics. The harmonics may include signals with frequencies that are integer multiples of the frequencies in the dominant sub-band. Because the first filter 205 removed frequency components other than those in the dominant sub-band, the harmonic engine 206 may produce less intermodulation distortion and beat notes than if a wide band filter or no filter had been applied. The harmonics engine 240 may produce a signal that includes the dominant sub-band frequencies and the harmonics.

The example system 200 may include a second filter synthesis engine 207. The second filter synthesis engine 207 may receive parameters from the first filter synthesis engine 204, related to the first filter 205, wherein the second filter synthesis engine 207 can synthesize a second filter 208 to pass a subset of the harmonics. Frequencies in the dominant sub-band and some of the lower-order harmonics in the harmonics may be at frequencies that the audio output device cannot reproduce, so the second filter synthesis engine 207 may synthesis a second filter 208 to remove those frequencies. Also, higher-order harmonics above a predetermined upper frequency limit may have little effect in creating the perception of the dominant sub-band, so the second filter 208 may remove the higher-order harmonics as well. In some examples, the second filter 208 may keep some or all of the second harmonic, third harmonic, fourth harmonic, fifth harmonic, sixth harmonic, seventh harmonic, eighth harmonic, ninth harmonic, tenth harmonic, etc. The second filter 208 may output a signal that includes the subset of harmonics. In one example, the second filter 208 may include an input buffer or delay to compensate for signal processing delays associated with synthesizing the second filter 208. In one example, the second filter 208 may be a minimum phase filter IIR or FIR filter.

The second filter 208 may have a lower cutoff frequency and an upper cutoff frequency. As used herein, the term "cutoff frequency" refers to a frequency at which signals are attenuated by a particular amount (e.g., 3 dB, 6 dB, 10 dB, etc.) The second filter synthesis engine 207 may select the cutoff frequencies based on the first filter 205, which may have its own lower and upper cutoff frequencies. The lower cutoff frequency of the second filter 208 may be selected to be a first integer multiple of the lower cutoff frequency of the first filter 205, and the upper cutoff frequency of the second filter 208 may be selected to be a second integer multiple of the upper cutoff frequency of the first filter 205. The first and second integers may be different from each other. The first and second integers may be selected so that the lower cutoff frequency of the second filter 208 excludes harmonics below the capabilities of the audio output device and the upper cutoff frequency of the second filter 208 excludes harmonics that have little effect in creating the perception of the dominant sub-band. In one example, the first integer may be two, three, four, five, six, or the like, and the second integer may be three, four, five, six, seven, eight, nine, ten, or the like.

The system 200 may include a parametric filter engine 209. The parametric filter engine 209 may apply a gain to the subset of harmonics received from the second filter 208 by applying a parametric filter to the signal to shape the spectrum of the signal in order to maximize the psychoacoustic perception of the missing fundamental frequencies. The parametric filter engine 209 may receive an indication of the gains to apply to different segments of the spectrum from a gain engine 210 and an indication of the lower and upper cutoff frequencies of the second filter 208 from the second filter synthesis engine 207. The parametric filter engine 209 may synthesize the parametric filter based on the gain and the cutoff frequencies of the second filter 208. In one example, without limitation, the parametric filter may be a biquad filter (i.e., a second-order IIR filter). In some examples, gain may be applied to the signal containing the subset of harmonics without using a parametric filter, e.g., using an amplifier to apply a uniform gain to the signal containing the subset of harmonics.

The example system 200 may include an insertion engine 211 to insert the amplified subset of harmonics from the parametric engine 209 into an audio stream comprising a modified version of the original audio input stream. As illustrated in FIG. 2, the (original) audio input stream is couple to the insertion engine 211 through a high-pass filter 212 and a delay engine 213. In one example, the high-pass filter 212 removes all of the low frequency component of the audio input stream that cannot be reproduced by the audio output device 214. The delay engine 213 operates to bring the remaining high frequency components of the filtered audio input stream (those which the audio output device can reproduce) into time alignment with the amplified set of harmonics in the insertion engine 211, which have been delayed by the signal processing described above.

For example, some or all of the engines, such as sub-band selection engine 203, first filter synthesis engine 204, harmonic engine 206, second filter synthesis engine 207, and parametric filter engine 209 may delay the amplified subset of harmonics relative to the audio input stream. Accordingly, the delay engine 213 may delay the filtered audio input stream to ensure it will be time-aligned with the amplified subset of the harmonics when the filtered audio input stream and the amplified subset of harmonics arrive at the insertion engine 211.

In one example, the insertion engine 211 combines the amplified subset of harmonics with the delayed and filtered audio input stream to create an audio output with harmonics. The amplified subset of harmonics may create the perception of the dominant low frequency components removed by the high-pass filter 212.

Turning now to FIG. 3, there is illustrated a table 300 identifying the upper and lower cutoff frequencies of an example auditory filter bank, such as filter bank 201, spanning a frequency range from 5 Hertz (the lower cutoff frequency of filter 1) to 283 Hertz (the upper cutoff frequency of filter 14). Table 300 defines a ⅓-octave filter bank with 14 filters. That is, the center frequencies of adjacent filters have a ratio of approximately $2^{1/3}$ (1.26:1) or $2^{-1/3}$ (0.793) depending on whether the order of the frequencies is increasing or decreasing.

FIGS. 4-7 are frequency spectra 400, 500, 600 and 700, respectively, illustrating the frequency content of four consecutive frames (frames 2-5) of an example input audio stream to be applied to a sub-band filter bank, such as filter bank 201, corresponding to the ⅓-octave filter bank defined by table 300 in FIG. 2. In each frame depicted in FIGS. 4-7, the maximum power point in the spectrum is clearly marked, along with an indication of the filter ID number (r) of the sub-band of table 300 in which the maximum value appears. For example, for frame 2 in FIG. 4, the maximum value occurs between 60 Hz and 70 Hz, which is inside the bandwidth of sub-band filter ID r=8. For frame 3 in FIG. 5, the maximum value also occurs between 60 Hz and 70 Hz, so the dominant sub-band is again in the bandwidth of filter ID r=8. For frame 4 in FIG. 6, the maximum value occurs between 120 Hz and 130 Hz, which is inside the bandwidth of sub-band filter ID r=11. For frame 5 in FIG. 7, the maximum value is again between 60 Hz and 70 Hz, so the dominant sub-band is again in the bandwidth of filter ID r=8.

Figure 8:
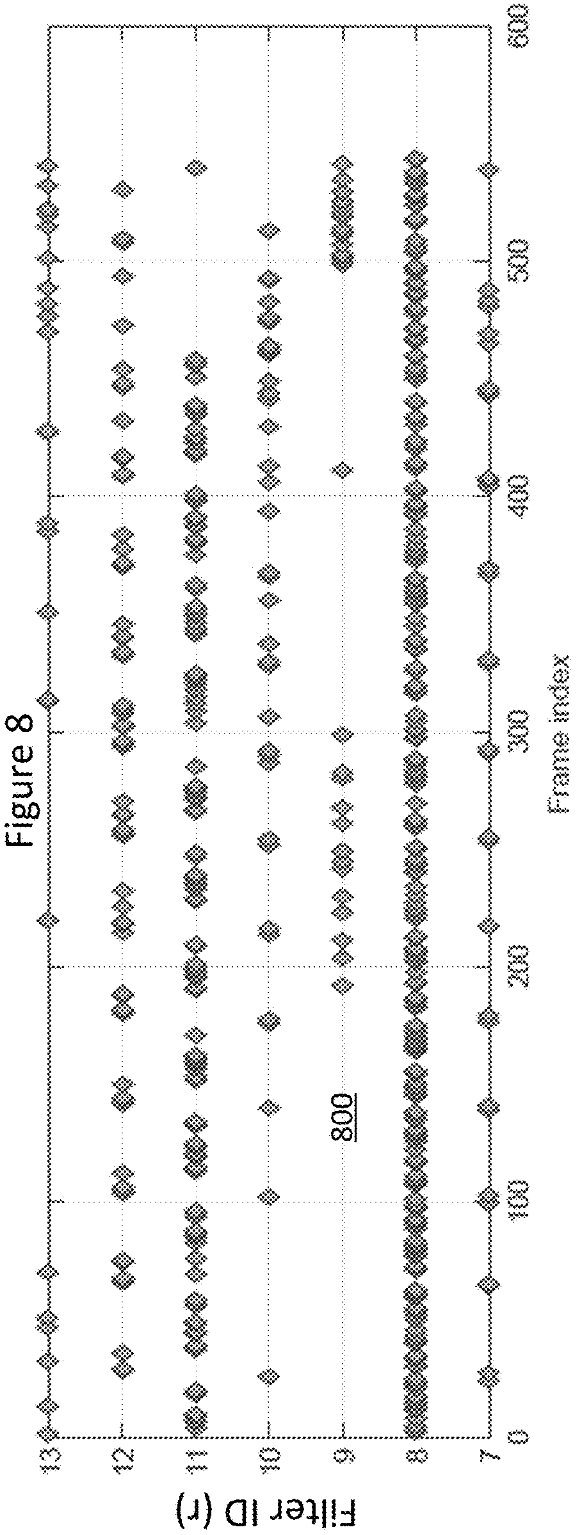
FIG. 8 is a histogram of dominant sub-bands in an example sequence of long audio frames of audio stream using the auditory filter bank of FIG. 7.
Figure 9:
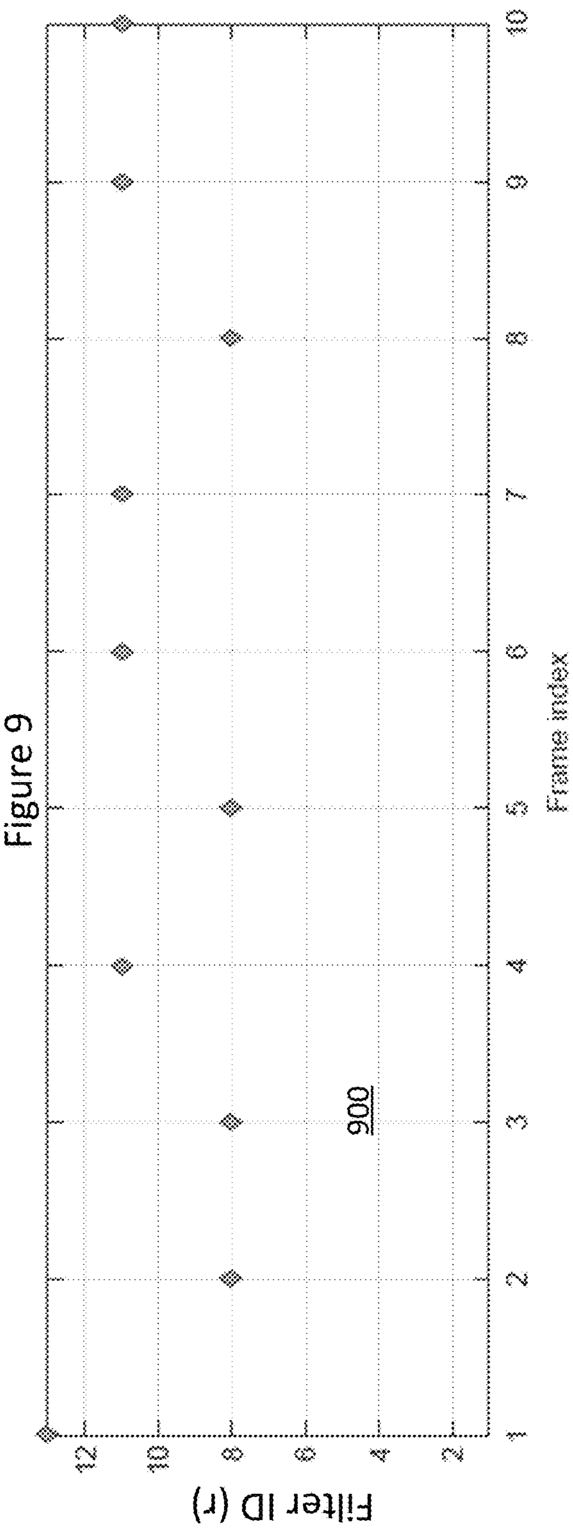
FIG. 9 is an expanded view of the first ten frames of the example of FIG. 8.

FIGS. 8 and 9 are histograms 600 and 900 respectively, illustrating the performance of a system, such as example system 200, when processing the audio streams of FIGS. 4-7, using the ⅓-octave filter bank defined by table 300 in FIG. 3 and the RMS power detectors of detector block 202 described above. FIG. 8 illustrates the selected dominant sub-band filter ID for each of 540 frames (including frames 2-5), using a frame size of F=5296 samples. At a sampling rate of 48 kHz (a typical Nyquist rate for audio), 5296 samples per frame provides a frequency resolution of approximately 10 Hz, which could resolve and detect even the lowest frequency musical tones, such as the lowest range of a pipe organ. The total duration of the musical sample was approximately 60 seconds (540×5296/48 kHz).

FIG. 9 is a magnified view of FIG. 8, illustrating the first 10 frames of FIG. 8. As can be seen in FIG. 9, the configuration of system 200 using the ⅓-octave filter bank of table 300 and a frame size of F=5296 samples, correctly identifies the dominant sub-bands for frame 2 (r=8), frame 3 (r=8), frame 4 (r=11), and frame 5 (r=8).

Figure 10:
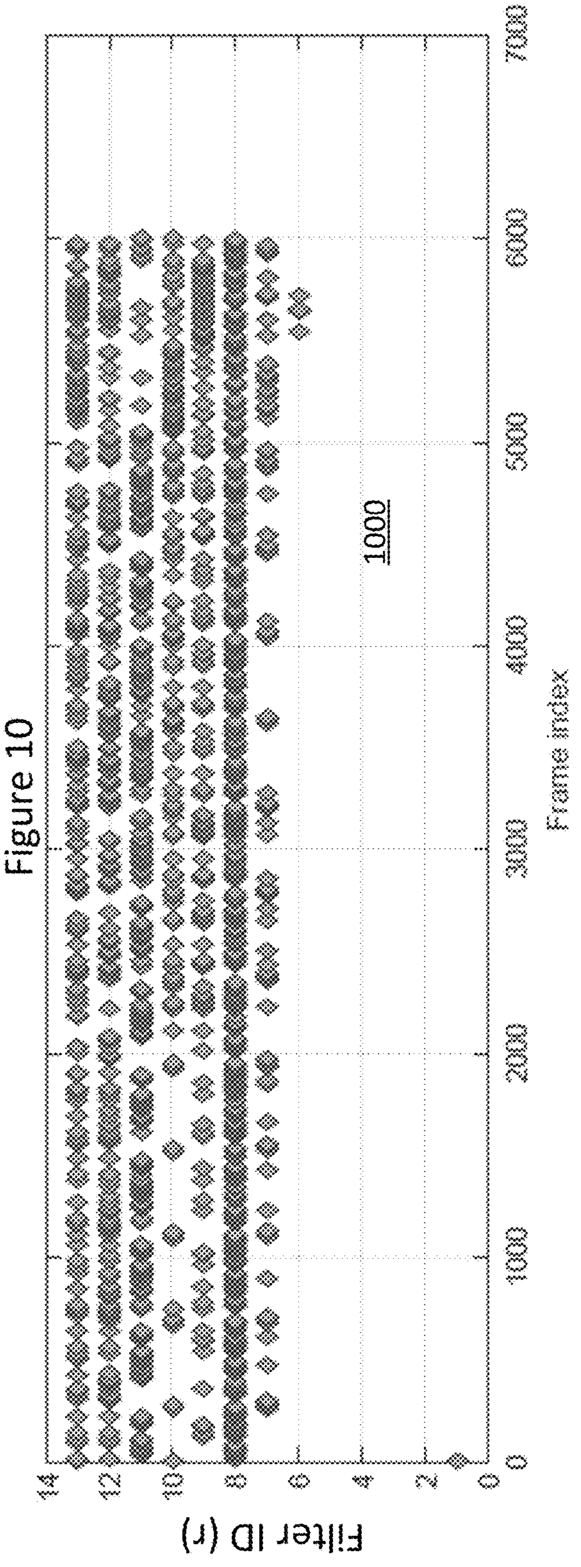
FIG. 10 is a histogram of dominant sub-bands in an example sequence of short audio frames using the auditory filter bank of FIG. 7.
Figure 11:
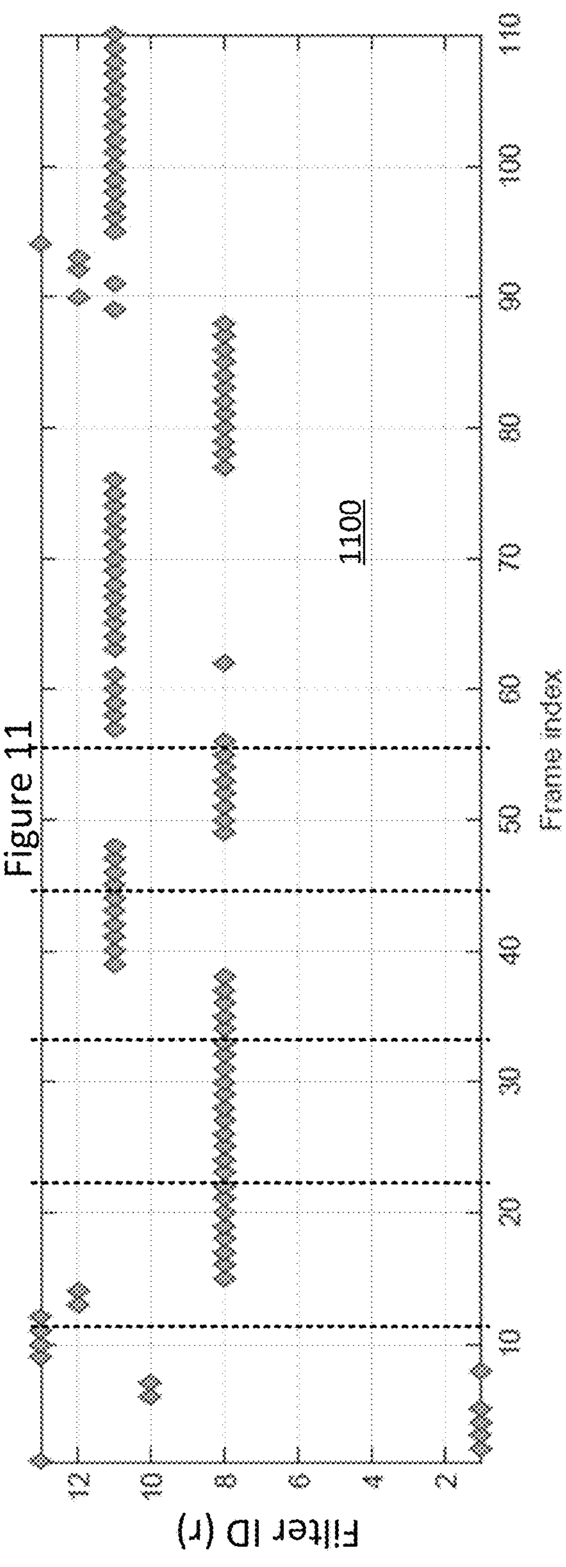
FIG. 11 is an expanded view of the first 110 frames of the example of FIG. 10.

FIGS. 10 and 11 are histograms 1000 and 1100, respectively, illustrating the performance of a system, such as example system 200, when processing the audio streams of FIGS. 4-7, using the ⅓-octave filter bank defined by table 300 in FIG. 3 and the RMS power detectors of detector block 202 described above. FIG. 10 illustrates the selected dominant sub-band filter ID for each of 6000 frames (including the equivalents of frames 2-5 in FIGS. 8 and 9), using a frame size of F=480 samples, as might be encounter using the audio encoders in the Windows 10® operating system. It will be appreciated that at a sampling rate of 48 kHz, with a frame size F=480, 6000 frames are required to render a 60 second sample.

FIG. 11 is a magnified view of FIG. 10, illustrating the first 110 frames of FIG. 10, corresponding to the first 10 frames of sample size 5296 in FIG. 9. In FIG. 11, vertical dashed lines illustrate boundaries between groups of 11 frames of size F=480, corresponding to a single frame size of F=5296. As can be seen in FIG. 11, the configuration of system 200, using the ⅓-octave filter bank of table 300 and a frame size of F=480 samples, generates some spurious responses. In FIG. 11, frames 1-11 (corresponding to frame 1 in FIG. 9) identify three different filter IDs (r=1, r=10 and r=13), compared to frame 1 in FIG. 9, which identifies only filter ID r=13. Frames 12-22 in FIG. 11 identify three different filter IDs (r=8, r=12 and r=13), while frame 2 in FIG. 9 identifies only filter ID r=8. Frames 23-33 in FIG. 11 correctly identify filter ID r=8 in agreement with frame 3 of FIG. 9. Frames 34-44 in FIG. 9 identify two different filter IDs (r=8 and r=11), while frame 4 of FIG. 9 identifies only filter ID r=11. And finally, frames 45-55 in FIG. 11 also identify filter IDs r=8 and r=11, while frame 5 of FIG. 9 identifies only filter ID r=8.

Figure 13:
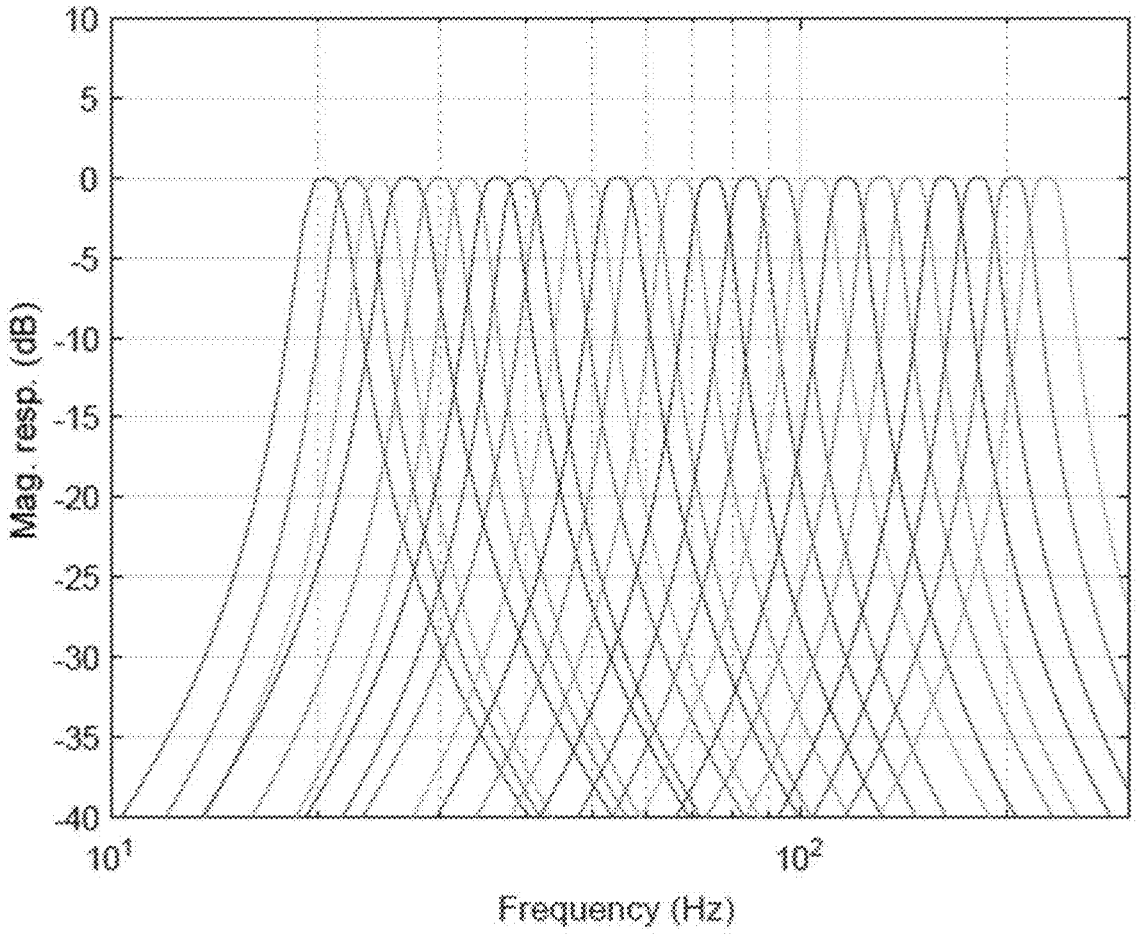
FIG. 13 is a plot illustrating the frequency responses of the example auditory filter bank of FIG. 12.

Turning now to FIG. 12, there is illustrated a table 1200 identifying the upper and lower cutoff frequencies of an example auditory filter bank, such as filter bank 201, spanning a frequency range from 19 Hertz (the lower cutoff frequency of filter 1) to 242 Hertz (the upper cutoff frequency of filter 24). Table 1200 defines a ⅙-octave filter bank with 24 filters. That is, the center frequencies of adjacent filters have a ratio of approximately $2^{1/6}$ (1.12:1) or $2^{-1/6}$ (0.89) depending on whether the order of the frequencies is increasing or decreasing. FIG. 13 is a plot 1300 illustrating the frequency response of the 24 filters defined by table 1200. In one example, filter bank 201 in example system 200 may be implemented according to table 1200 to reduce spurious filter identifications when small frame sizes are used (such as the F-480 sample frames described above.

Figure 14:
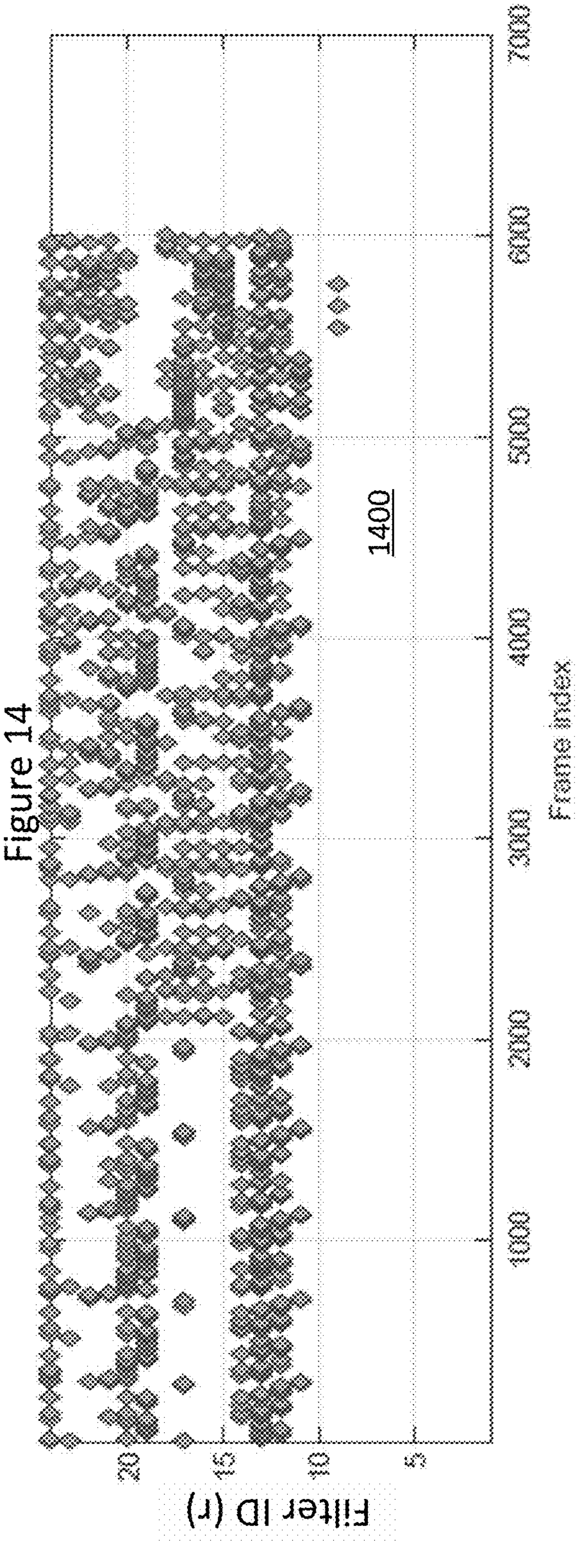
FIG. 14 is a histogram of dominant sub-bands in an example sequence of short frames of an audio stream.
Figure 15:
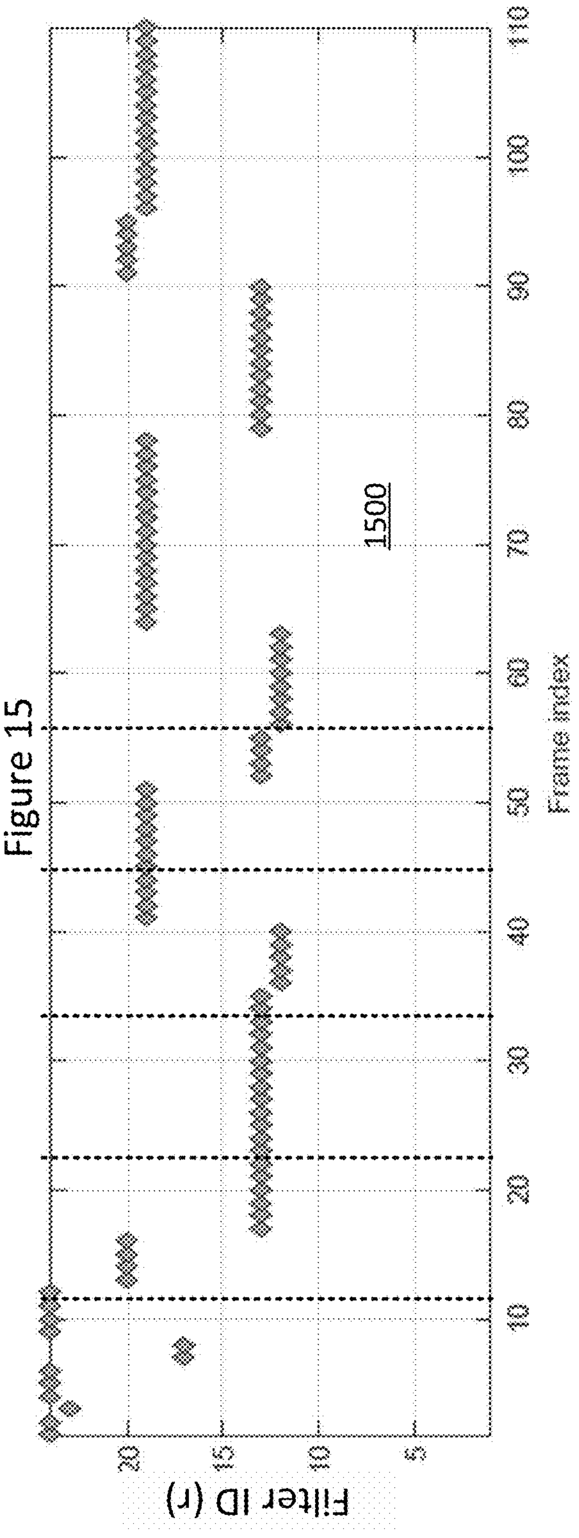
FIG. 15 is an expanded view of the first ten frames of the example of FIG. 14.

FIGS. 14 and 15 are histograms 1400 and 1500, respectively, illustrating the performance of a system, such as example system 200, when processing the audio streams of FIGS. 4-7, using the ⅙-octave filter bank defined by table 1200 in FIG. 12 and the RMS power detectors of detector block 202 described above. FIG. 14 illustrates the selected dominant sub-band filter ID for each of 6000 frames (including the equivalents of frames 2-5 in FIGS. 8 and 9), using a frame size of F=480 samples, as might be encountered using the audio encoders in the Windows 10® operating system. It will be appreciated that at a sampling rate of 48 kHz, with a frame size F=480, 6000 frames are required to render a 60 second sample.

FIG. 15 is a magnified view of FIG. 14, illustrating the first 110 frames of FIG. 10, corresponding to the first 10 frames of sample size 5296 in FIG. 9. In FIG. 15, vertical dashed lines illustrate boundaries between groups of 11 frames of size F=480, corresponding to a single frame size of F=5296. As can be seen in FIG. 15, the configuration of system 200, using the ⅙-octave filter bank of table 1200 and a frame size of F=480 samples, performs better than the ⅓-octave filter configuration described above.

In FIG. 15, frames 1-11 (corresponding to frame 1 in FIG. 9) identify three different filter IDs: r=24 (215-242 Hz), r=23 (192-216 Hz), and r=17 (99-112 Hz). Frame 1 in FIG. 9 identifies only filter ID r=13 (179-226 Hz), which overlaps the bandwidths of filter ID r=24 and filter ID r=23 in FIG. 15. And notably, there is no spurious identification of a low frequency filter such as filter ID r=1 (5-18 Hz) in FIG. 11.

Frames 12-22 in FIG. 15 identify two different filter IDs: r=20 (137-154 Hz) and r=13 (63-71 Hz). Frame 2 in FIG. 9 identifies only filter ID r=8 (58-74 Hz), which overlaps the bandwidth of filter ID r=13 in FIG. 15.

Frames 23-33 in FIG. 15 identify filter ID r=13 (63-71 Hz) in agreement with frame 3 of FIG. 9 which identifies filter ID r=8 (58-74 Hz).

Frames 34-44 in FIG. 15 identify two different filter IDs: r=19 (123-139 Hz) and r=11 (51-58 Hz). Frame 4 of FIG. 9 identifies only filter ID r=11 (114-144), which overlaps the bandwidth of filter ID r=19 in FIG. 15.

And finally, frames 45-55 in FIG. 15 identify filter IDs r=19 (123-139 Hz) and r=13 (63-71 Hz). Frame 5 of FIG. 9 identifies only filter ID r=8 (58-74 Hz), which overlaps the bandwidth of filter ID r=13 in FIG. 15.

Figure 16:
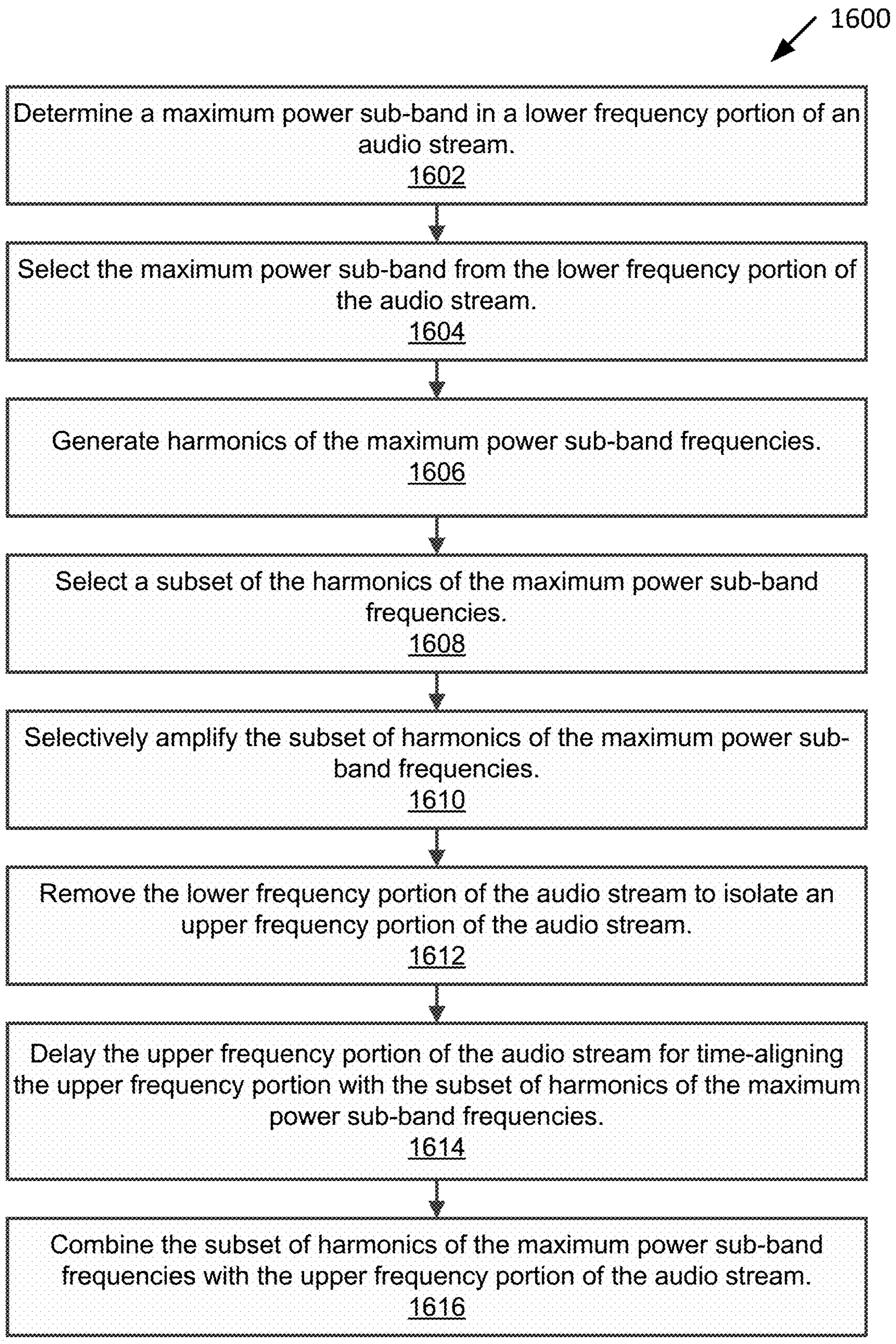
FIG. 16 is a flowchart illustrating an example method for perceived bandwidth extension.

FIG. 16 is a flowchart illustrating an example method 1600 for perceived bandwidth extension of an audio signal that may be performed by the example system 200 of FIG. 2.

The example method 1600 may include determining a maximum power sub-band in a lower frequency portion of an audio stream (block 1602). For example, block 1602 may be performed by the example system 200 by separating the lower frequency portion of the audio stream into sub-bands using an auditory filter bank such as filter bank 201, measuring the RMS power in each sub-band with a bank of detectors such as detector bank 202 in example system 200, and identifying the maximum power sub-band using a sub-band selection engine such as sub-band selection engine 203 in example system 200.

The example method 1600 may include selecting the maximum power sub-band from the lower frequency portion of the audio stream (block 1604). For example, block 1604 may be performed by the example system 200 by using a filter synthesis engine, such as first filter synthesis engine 204 in example system 200 to synthesize a filter, such as first filter 205 in example system 200, and using first filter 205 to extract the maximum power sub-band frequencies from the audio stream.

The example method 1600 may also include generating harmonics of the maximum power sub-band frequencies (block 1606). For example, block 1606 may be performed by example system 200 by applying the maximum power sub-band frequencies from the first filter 205, to a harmonic engine, such as harmonic engine 206 in example system 200.

The example method 1600 may also include selecting a subset of the harmonics of the maximum power sub-band frequencies (block 1608). For example, block 1608 may be performed by example system 200 by using a filter synthesis engine, such as second filter synthesis engine 207 in example system 200 to synthesis a filter, such as second filter 208 in example system 200 to select the subset of harmonic, where the subset is selected to remove harmonics that are below the capabilities of the intended audio output device, and to remove harmonics that have little effect in creating the perception of the dominant sub-band frequencies.

The example method 1600 may also include selectively amplifying the subset of harmonics of the maximum power sub-band frequencies (block 1610). For example, block 1610 may be performed by example system 200 by a parametric filter engine, such as parametric filter engine 209 in example system 200, by applying a parametric filter to the subset of harmonics, which may apply frequency selective gain shaping to the sub-set of harmonics.

The example method 1600 may also include removing the lower frequency portion of the audio stream to isolate an upper frequency portion of the audio stream (block 1612). For example, block 1612 may be performed by example system 200 by using a high-pass filter, such as high-pass filter 212 to remove frequency components from the audio stream that cannot be reproduced by the intended audio output device.

The example method 1600 may also include delaying the upper frequency portion of the audio stream to time-align the upper frequency portion of the audio stream with the subset of harmonics (block 1614). For example, block 1614 may be performed by example system 200 by using a delay engine, such as delay engine 213 in example system 200, where delay engine 213 compensates for any signal processing delays associated with processing engines, such as sub-band selection engine 203, first filter synthesis engine 204, harmonic engine 206, second filter synthesis engine 207, and parametric filter engine 209, and the like.

Finally, the example method 1600 may also include combining the subset of harmonics of the maximum power sub-band frequencies with the upper frequency portion of the audio stream to create the perception of extended low-frequency (block 1616). For example, block 1616 may be performed by example system 200 by using an insertion engine, such as insertion engine 211 to add the subset of harmonics of the maximum power sub-band frequencies to the filtered and time-aligned upper frequency portion of the audio stream.

Figure 17:
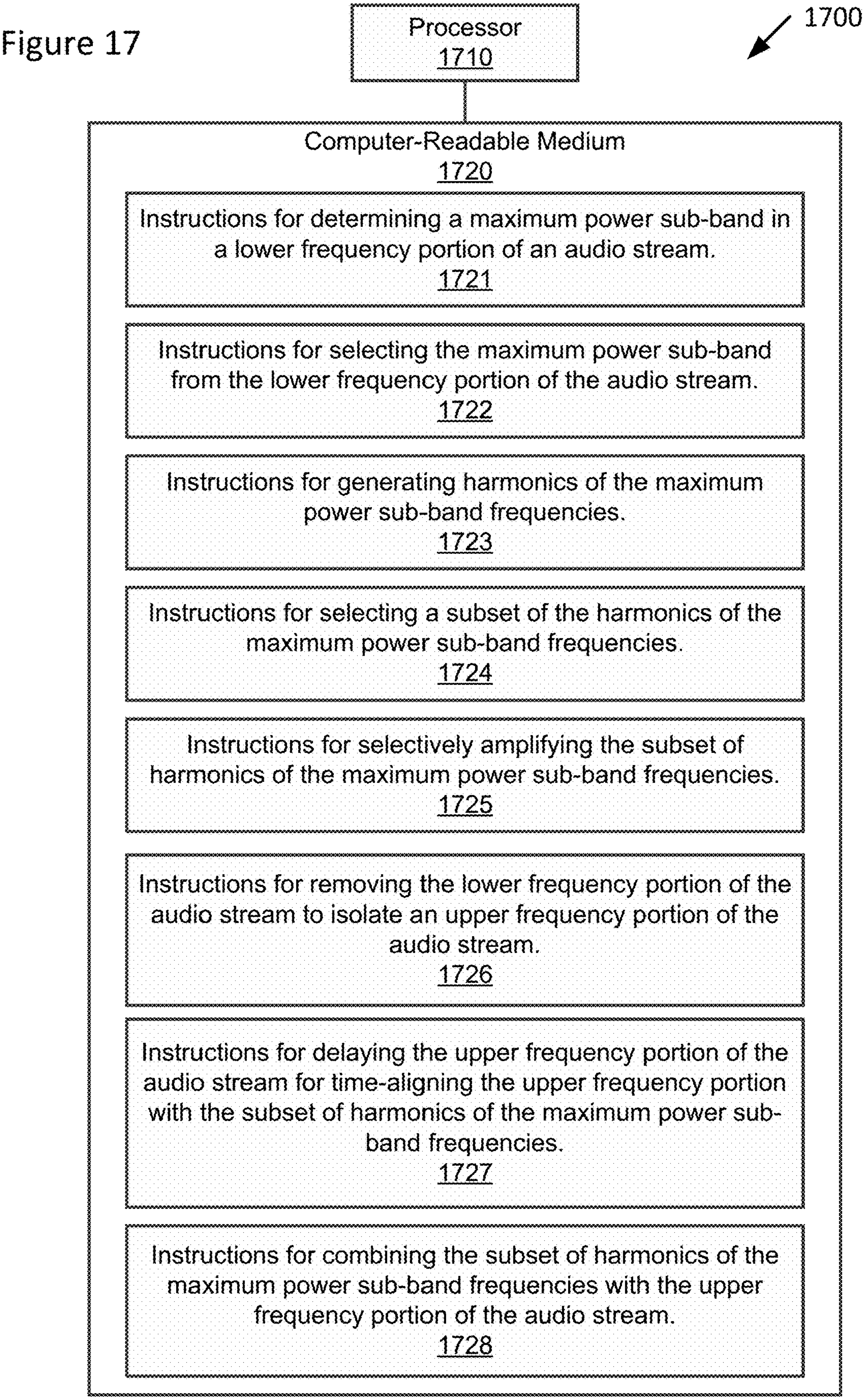
FIG. 17 is a block diagram illustrating an example system with a computer-readable storage medium including instructions executable by a processor for perceived bandwidth extension.

Referring now to FIG. 17, there is illustrated a block diagram of an example system 1700 with a non-transitory computer-readable storage medium including instructions, that when executed by a processor, cause the processor to produce an audio output that creates the perception of a missing low frequency component. The system 1700 includes a processor 1710 and a non-transitory computer-readable storage medium 1720. The computer-readable storage medium 1720 includes example instructions 1721-1728 executable by the processor 1710 to perform various functionalities described herein. In various examples, the non-transitory computer-readable storage medium 1720 may be any of a variety of storage devices including, but not limited to, a random-access memory (RAM) a dynamic RAM (DRAM), static RAM (SRAM), flash memory, read-only memory (ROM), programmable ROM (PROM), electrically erasable PROM (EEPROM), or the like. In various examples, the processor 1710 may be any type of general purpose processor or special purpose logic, such as a microprocessor, a digital signal processor, a microcontroller, an ASIC, an FPGA, a programmable array logic (PAL), a programmable logic array (PLA), a programmable logic device (PLD), etc.

The example instructions include instructions 1721 for determining a maximum power sub-band in a lower frequency portion of an audio stream. For example, instructions 1721 may cause the processor 1710 to separate the lower frequency portion of the audio stream into sub-bands using an auditory filter bank such as filter bank 201 in example system 200, measure the RMS power in each sub-band with a bank of detectors such as detector bank 202 in example system 200, and identify the maximum power sub-band using a sub-band selection engine such as sub-band selection engine 203 in example system 200.

The example instructions may also include instructions 1722 for selecting the maximum power sub-band from the lower frequency portion of the audio stream. For example, instructions 1722 may cause the processor 1710 to implement a filter synthesis engine, such as first filter synthesis engine 204 in example system 200 to synthesize a filter, such as first filter 205 in example system 200, and to use first filter 205 to extract the maximum power sub-band frequencies from the audio stream.

The example instructions may also include instructions 1723 for generating harmonics of the maximum power sub-band frequencies. For example, instructions 1723 may cause the processor 1710 to apply the maximum power sub-band frequencies from the first filter 205, to a harmonic engine, such as harmonic engine 206 in example system 200.

The example instructions may also include instructions 1724 for selecting a subset of the harmonics of the maximum power sub-band frequencies. For example, instructions 1724 may cause the processor 1710 use a filter synthesis engine, such as second filter synthesis engine 207 in example system 200, to synthesis a filter, such as second filter 208 in example system 200, to select the subset of harmonics, where the subset is selected to remove harmonics that are below the capabilities of the intended audio output device, and to remove harmonics that have little effect in creating the perception of the dominant sub-band frequencies.

The example instructions may also include instructions 1725 for selectively amplifying the subset of harmonics of the maximum power sub-band frequencies. For example, the instructions 1725 may cause the processor 1710 to implement a parametric filter engine, such as parametric filter engine 209 in example system 200, by applying a parametric filter to the subset of harmonics, which may apply frequency selective gain shaping to the sub-set of harmonics to enhance the perception of a missing fundamental frequency.

The example instructions may also include instructions 1725 for removing the lower frequency portion of the audio stream to isolate an upper frequency portion of the audio stream. For example, the instructions 1726 may cause the processor 1710 to implement a high-pass filter, such as high-pass filter 212 in example system 200 to remove frequency components from the audio stream that cannot be reproduced by the intended audio output device.

The example instructions may also include instructions 1727 for delaying the upper frequency portion of the audio stream for time-aligning the upper frequency portion with the subset of harmonics of the maximum power sub-band frequencies. For example, instructions 1727 may cause the processor 1710 to implement a delay engine, such as delay engine 213 in example system 200, where delay engine 213 compensates for any signal processing delays associated with processing engines, such as sub-band selection engine 203, first filter synthesis engine 204, harmonic engine 206, second filter synthesis engine 207, and parametric filter engine 209, and the like.

The example instructions may also include instructions 1728 for combining the subset of harmonics of the maximum power sub-band frequencies with the upper frequency portion of the audio stream. For example, instructions 1728 may cause the processor to implement an insertion engine, such as insertion engine 211 to add the subset of harmonics of the maximum power sub-band frequencies to the filtered and time-aligned upper frequency portion of the audio stream.

The foregoing description of various examples has been presented for purposes of illustration and description. The foregoing description is not intended to be exhaustive or limiting to the examples disclosed, and modifications and variations are possible in light of the above teachings or may be acquired from practice of various examples. The examples discussed herein were chosen and described in order to explain the principles and the nature of various examples of the present disclosure and its practical application to enable one skilled in the art to utilize the present disclosure in various examples and with various modifications as are suited to the particular use contemplated. The features of the examples described herein may be combined in all possible combinations of methods, apparatus, modules, systems, and computer program products.

It is also noted herein that while the above describes examples, these descriptions should not be viewed in a limiting sense. Rather, there are several variations and modifications which may be made without departing from the scope as defined in the appended claims.

What is claimed is:

1. A system, comprising:
- a filter bank including sub-octave filters to separate a lower frequency portion of an audio stream into at least two sub-bands;
- a detector bank including detectors coupled with the filter bank to determine an audio power level in each of the at least two sub-bands;
- a sub-band selection engine coupled with the detector bank to determine a dominant sub-band in the lower frequency portion of the audio stream based at least in part on the audio power level in each of the at least two sub-bands;
- a first filter engine to isolate the dominant sub-band from the audio stream;
- a harmonic engine coupled with the first filter to generate harmonics of the dominant sub-band; and
- a second filter engine coupled with the harmonic engine to select a sub-set of the harmonics.

2. The system of claim 1, further comprising:
- an insertion engine to combine the subset of harmonics of the dominant sub-band with an upper frequency portion of the audio stream; and
- an output device coupled with the insertion engine.

3. The system of claim 2, wherein the first filter engine comprises a first filter synthesizer and a first filter, and wherein the second filter engine comprises a second filter synthesizer and a second filter.

4. The system of claim 3, further comprising a parametric filter coupled between the second filter and the insertion engine to selectively shape the subset of harmonics of the dominant sub-band for perception of the dominant sub-band.

5. The system of claim 2, further comprising:
- a delay engine to time-align the audio stream with the subset of harmonics of the dominant sub-band; and
- a high-pass filter coupled between the delay engine and the insertion engine to remove the lower frequency portion of the audio stream.

6. The system of claim 1, wherein the filters of the filter bank have overlapping cutoff frequencies.

7. The system of claim 1, wherein the detectors of the detector bank determine the audio power level of each sub-band by computing an infinity norm for each sub-band.

8. A method, comprising:

determining a maximum power sub-band in a lower frequency portion of an audio stream;

selecting the maximum power sub-band from the lower frequency portion of the audio stream;

generating harmonics of the maximum power sub-band frequencies;

selecting a subset of the harmonics of the maximum power sub-band frequencies; and combining the subset of harmonics of the maximum power sub-band frequencies with an upper frequency portion of the audio stream.

9. The method of claim 8, wherein generating harmonics of the maximum power sub-band frequencies comprises:

synthesizing a first bandpass filter to extract the maximum power sub-hand frequencies from the audio stream; and applying the maximum power sub-band frequencies to a harmonic engine.

10. The method of claim 8, wherein selecting a subset of the harmonics of the maximum power sub-band frequencies comprises:

synthesizing a second bandpass filter corresponding to the subset of the harmonics; and applying the harmonics of the maximum power sub-band frequencies from the harmonic engine to the second bandpass filter.

11. The method of claim 8, wherein determining the maximum power sub-band comprises:

separating the lower frequency portion of the audio stream into at least two sub-bands with a bank of sub-octave filters; and detecting the signal power in each of the at least two sub-bands.

12. The method of claim 8, further comprising:

removing the lower frequency portion of the audio stream to isolate an upper frequency portion of the audio stream;

selectively amplifying the subset of harmonics of the maximum power sub-band; and delaying the upper frequency portion of the audio stream for time-aligning the upper frequency portion with the subset of harmonics of the maximum power sub-band.

13. The method of claim 8, further comprising:

filtering the lower frequency portion of the audio stream into multiple sub-bands; and selecting the maximum power sub-band from the multiple sub-bands with a detector bank receiving the multiple sub-bands from the filtering.

14. The method of claim 8, further comprising newly determining the maximum power sub-band in the lower frequency portion of the audio stream for each frame of the audio stream.

15. The method of claim 14, further comprising using a smoothing filter to smooth a change between selected sub-bands between frames of the audio stream.

16. A non-transitory computer-readable medium comprising instructions that, when executed by a processor, cause the processor to:

determine a dominant sub-band in a lower frequency portion of audio stream;

select the dominant sub-band from the lower frequency portion of the audio stream;

generate harmonics of the dominant sub-band;

select a subset of the harmonics of the dominant sub-band; and combine the subset of harmonics of the dominant sub-band with an upper frequency portion of the audio stream.

17. The non-transitory computer-readable medium of claim 16, wherein to generate harmonics of the dominant sub-band, the instructions further cause the processor to:

synthesize a first bandpass filter to extract the dominant sub-band signal from the audio stream; and apply the dominant sub-band signal to a harmonic engine.

18. The non-transitory computer-readable medium of claim 16, wherein to select the subset of the harmonics of the dominant sub-band, the instructions further cause the processor to:

synthesize a second bandpass filter corresponding to the subset of the harmonics; and apply the harmonics of the dominant sub-band from the harmonic engine to the second bandpass filter.

19. The non-transitory computer-readable medium of claim 16, wherein to determine the dominant sub-band, the instructions further cause the processor to:

separate the lower frequency portion of the audio stream into at least two sub-bands with a bank of sub-octave filters; and detect the signal power in each of the sub-bands.

20. The non-transitory computer-readable medium of claim 16, where the instructions further cause the processor to:

filter the audio stream to remove the lower frequency portion of the audio stream;

amplify the subset of harmonics of the dominant hub-band; and delay the upper frequency portion of the audio stream for time-aligning the upper frequency portion with the subset of harmonics of the dominant sub-band.

* * * * *